United States Patent [19]

Iwata et al.

[11] Patent Number: 5,066,131
[45] Date of Patent: Nov. 19, 1991

[54] STAGE MECHANISM

[75] Inventors: Mikio Iwata, Ibaraki; Takao Kariya, Tokyo; Masaru Ohtsuka, Yokohama, all of Japan

[73] Assignee: Canon Kabushiki Kaisha, Tokyo, Japan

[21] Appl. No.: 388,484

[22] Filed: Aug. 2, 1989

[30] Foreign Application Priority Data

Aug. 17, 1988 [JP] Japan .................. 63-203110

[51] Int. Cl.$^5$ .............................................. G01B 11/00
[52] U.S. Cl. ............................ 356/401; 250/442.1; 250/492.2
[58] Field of Search ............. 356/72, 401, 399, 400; 250/492.2, 442.1; 33/568, 573

[56] References Cited

U.S. PATENT DOCUMENTS

| | | | |
|---|---|---|---|
| 4,676,649 | 6/1987 | Phillips | 356/401 |
| 4,749,867 | 6/1988 | Matsushita et al. | 250/442.1 |
| 4,803,712 | 2/1989 | Kembo et al. | 250/492.2 |
| 4,814,625 | 3/1989 | Yabu | 356/401 |
| 4,856,037 | 8/1989 | Mueller et al. | 378/34 |
| 4,887,804 | 12/1989 | Ohtsuka | 33/568 |
| 4,891,526 | 1/1990 | Reeds | 356/401 |

FOREIGN PATENT DOCUMENTS 0253283 1/1988 European Pat. Off. .

OTHER PUBLICATIONS

Folchi et al., "X-ray Lithography Mask Alignment Stage," IBM Technical Disclosure Bulletin; vol. 25, No. 12, May 1983.

*Primary Examiner*—Richard A. Rosenberger
*Assistant Examiner*—Hoa Pham
*Attorney, Agent, or Firm*—Fitzpatrick, Cella, Harper & Scinto

[57] ABSTRACT

Disclosed is a stage device suitably usable in a semiconductor microcircuit device manufacturing exposure apparatus for printing a pattern of a mask on a semiconductor wafer, for supporting and positioning the wafer with respect to plurality of directions. The device includes two plate members coupled to each other with a predetermined distance maintained therebetween. Each plate member has formed therein X, Y and $\theta$ stages defined by plural cutout grooves. Each stage is resiliently supported by a leaf spring functioning portion formed in the plate member. A Z stage for displacing the wafer in the Z direction is mounted to an outer circumferential part of one plate member, and a measuring mirror operable in combination with a laser interferometer is provided as a unit with the Z stage. Any motion of each stage can be controlled on the basis of the measurement made by using this mirror. The structure of the stage device ensures high precision and high rigidity and, therefore, the Z axis can be set substantially horizontally. Consequently the stage device is suitably applicable to an exposure apparatus to be used with an SOR ring.

20 Claims, 5 Drawing Sheets

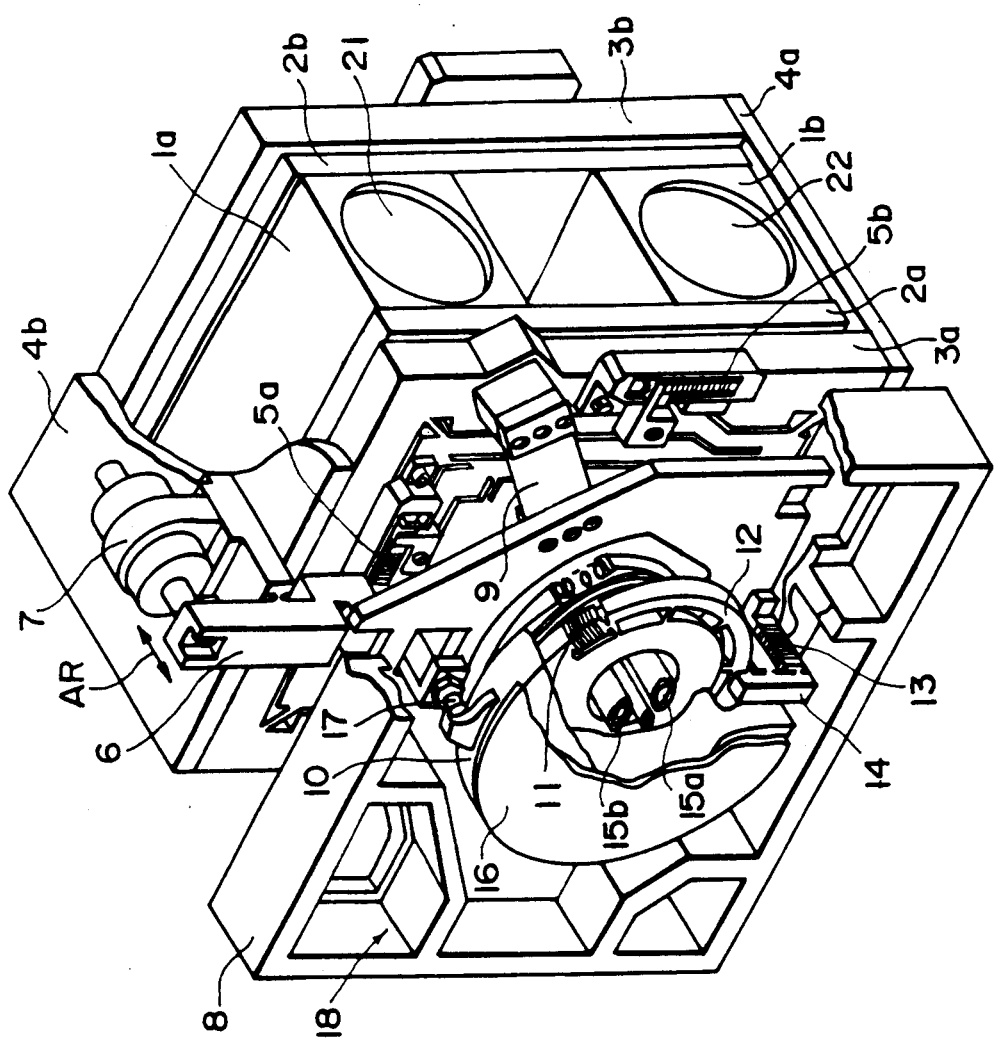
FIG. 1
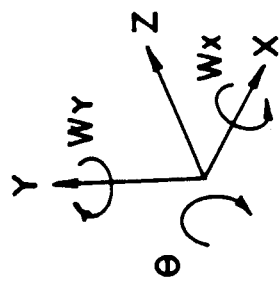

STAGE MECHANISM

FIELD OF THE INVENTION AND RELATED ART

The invention relates to a stage mechanism and, more particularly, to a stage device suitably usable in a semiconductor device manufacturing exposure apparatus for printing a pattern of a mask on a semiconductor wafer, for displacing and positioning the semiconductor wafer with a high degree of freedom. The stage device of the present invention is particularly suitably applicable to what is called an "X-ray stepper" for printing a pattern of a mask on each of different shot areas on a semiconductor wafer in a step-and-repeat manner, by using X-rays contained in synchrotron radiation.

FIGS. 6 and 7 show an example of a stage device having been used conventionally. FIG. 6 shows the appearance of the stage device, and FIG. 7 shows the structure of the stages of the stage device of FIG. 6.

In FIGS. 6 and 7, denoted at 101 is a base of the device; at 102 is a Y stage; and at 103 is an X stage. The X stage 103 carries thereon a mirror 104 for distance measurement and a member 105 to be driven. Laser beams 106a and 106b impinge on the measuring mirror 104, to allow observation of any motion of each stage.

Another example of a stage device having been used conventionally is illustrated in FIGS. 8, 9 and 10. FIG. 8 shows the appearance of this stage device, FIG. 9 shows the inside structure of this stage device and FIG. 10 is a schematic illustration of this stage device.

In FIGS. 8 and 10, denoted at 201 is a base of the device on which a rough-motion X stage 202, a rough-motion Y stage 203 and a fine-motion stage 204 are arranged in the named order. Further, on the fine-motion stage 204, a mirror 205 for distance measurement and a member 206 to be driven are placed. Denoted at 207a and 207b are laser beams which are projected on the measuring mirror 205 for observation of any motion of each stage.

FIG. 9 shows details of the fine-motion stage 204. In this FIG., denoted at 220 is a fine-motion X stage; at 221 is a fine-motion Y stage; and at 222 is a fine-motion $\theta$ (rotational) stage. On the fine-motion $\theta$ stage 222, the measuring mirror and the member 206 to be driven are placed. Denoted at 209, 210 and 211 are resilient members; and denoted at 208, 212 and 213 are electrostrictive devices. The stages are coupled to the resilient members 209, 210 and 211 as illustrated, and the drive of these stages are provided by the electrostrictive devices 208, 212 and 213.

SUMMARY OF THE INVENTION

In the first and second examples described hereinbefore, because of their structures, the stage device cannot be disposed vertically with its Z axis extending substantially horizontally. For this reason, these stage devices cannot be used in X-ray lithography using X-rays contained in synchrotron orbital radiation (SOR) light, for supporting and displacing a semiconductor wafer. Since the synchrotron radiation light is emitted from an SOR ring horizontally, in the lithography using the same, it is necessary to set the Z axis of a stage device substantially horizontally.

Further, the first example is not equipped with fine-motion mechanisms with respect to the X, Y, $\theta$ and tilt directions. Therefore, until the end of the final stage, the positioning of a semiconductor wafer must be executed by using the X-Y stage shown in FIG. 7. As a result, in order to accomplish high-precision positioning with the FIG. 1 example, the X-Y stage itself must have high precision and high rigidity. Inevitably the structure of the device becomes bulky. The term "tilt direction" means the inclination of the Z-axis with respect to the X-Y plane. On the other hand, while the second example is equipped with a fine-motion mechanism, no attention has been paid to the displacement of a semiconductor wafer in the tilt direction.

An object of the present invention is to provide a stage device which can be disposed vertically as desired.

Another object of the present invention is to provide a stage device which has high precision and high rigidity with respect to each of the X, Y, $\theta$, Z and tilt directions and which is compact as compared with the conventional examples.

In accordance with an aspect of the present invention, to achieve these objects, a stage device includes two plate members which are coupled to each other with a predetermined distance maintained therebetween. Each plate member is formed with a plurality of cut-out grooves to provide an X stage, a Y stage and a $\theta$ stage. Each stage is resiliently supported to the other stages by means of leaf spring means formed in the plate member. A Z stage for displacing a wafer in the Z direction and/or the tilt direction is mounted to the outer circumferential part of one of the plate members. The motion of all the X, Y and $\theta$ stages of the two plate members is controlled on the basis of a measurement made by using the laser interferometer system having a measuring mirror.

In accordance with another aspect of the present invention, a stage device is equipped with a Z stage, a rough-motion $\theta$ stage mounted on the Z stage and a locking mechanism for locking the rotation of the rough-motion $\theta$ stage. The locking mechanism is provided to be positioned inside a measuring mirror which has a substantially rectangular shape.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a perspective view of a stage device according to one embodiment of the present invention.

DESCRIPTION OF THE PREFERRED EMBODIMENTS

Figure 2:
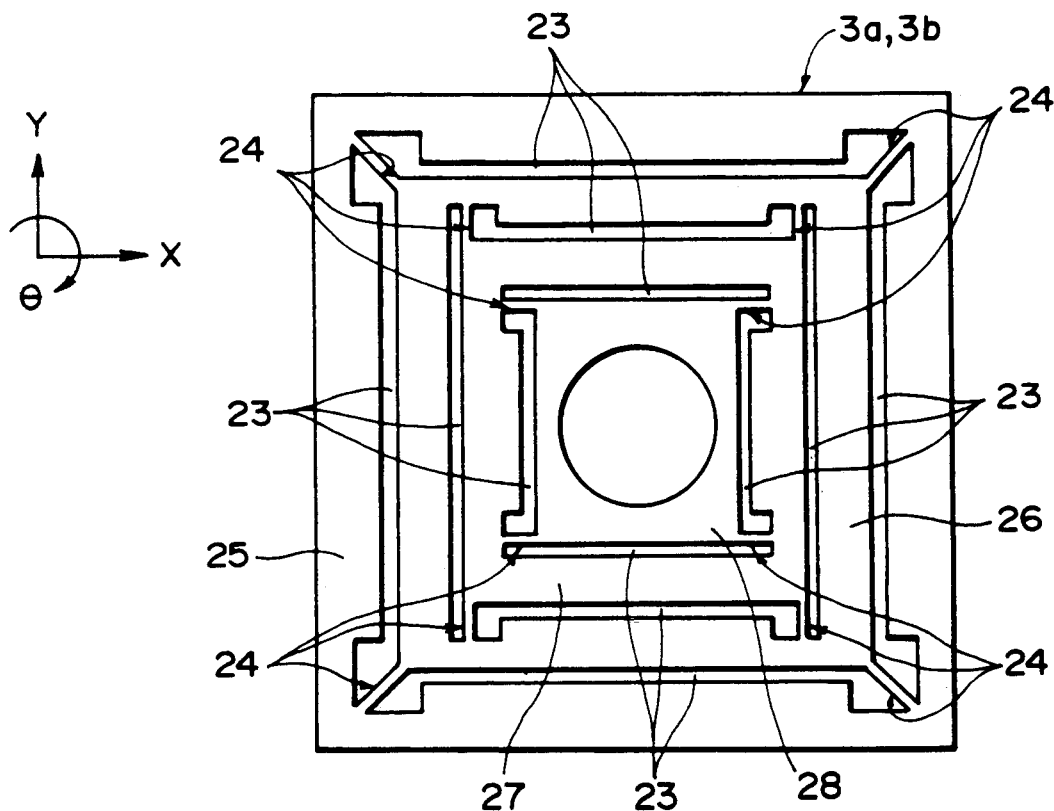
FIG. 2 is a plan view of a plate member of the FIG. 1 embodiment.

FIG. 1 shows the appearance of a fine-motion stage device according to one embodiment of the present invention, wherein some parts such as the coupling plates, the measuring mirror and the like are omitted for illustration of the inside structure of the device. Denoted in FIG. 1 at 1a and 1b are linear air sliders providing a rough-motion X stage; at 2a and 2b are coupling plates for coupling the linear air sliders 1a and 1b to each other. The air slider mechanism is such that: Two guide bars (not shown) are inserted into circular openings 21 and 22; piping is made from the outside to the sliders 1a and 1b to supply a flow of air into the clearance between the slider 1a (1b) and the corresponding guide bar, whereby the device as a whole shown in FIG. 1 floats by the air supply relatively to the guide bars, such that the device can slide along the guide bars. The guide bars are supported by air sliders (not shown) which provide a rough-motion Y stage (not shown). Plate members 3a and 3b, each being equipped with a leaf spring functioning with respect to the three directions of X, Y and $\theta$, are mounted outside the coupling plates 2a and 2b. These plate members 3a and 3b are coupled to each other by means of coupling plates 4a and 4b. Each of the plate members 3a and 3b is provided with electrostrictive devices 5a, 5b and 5c (FIG. 4) mounted thereto. Each of the coupling plates 4a and 4b is provided with one or more lever hinges 6 (only one is illustrated) having an enlarging function. In this embodiment, two lever hinges 6 are mounted to and supported by the coupling plate 4a, whereas one lever hinge 6 is mounted to and supported by the coupling plate 4b, these lever hinges being disposed equidistantly with respect to the $\theta$ direction. At the side of the point of force, each lever hinge 6 is coupled to an inch-worm motor 7 (only one is illustrated) which uses electrostrictive means. At the side of the point of action, each lever hinge 6 is coupled to a distance measuring mirror 8 made of ceramics.

The measuring mirror 8 is provided by a box-like member 18 (Z and tilt stage) whose side surfaces provide reflection surfaces. The member 18 is supported by the outermost circumferential part ($\theta$ stage 25) of the plate member 3a through three leaf springs 9 (only one is illustrated), so that the member 18 can be moved in the Z and tilt directions. Inside the measuring mirror 8, there is provided a wafer chuck 10 ($\theta$ stage) having a rough-motion rotating function. Inside the wafer chuck 10, there are provided a pusher spring 12 having therein one or more electrostrictive devices 11, and a clamper 14 having therein one or more electrostrictive devices 13. Denoted at 15a and 15b are tubes which are provided for the temperature control of the wafer chuck 10. Denoted at 16 is a wafer, and denoted at 17 is an eddy current sensor.

FIG. 2 is a plan view of the plate member 3a (3b). As illustrated, each of the plate members 3a and 3b is provided with a number of cutout grooves 23 by which leaf spring portions 24 are formed as illustrated. Additionally, around a fixed portion 28 which is fixed to the coupling plates 2a and 2b, there are formed a fine-motion Y stage 27, a fine-motion X stage 26 and a fine-motion $\theta$ stage 25 in the named order, these stages being concentric with respect to the fixed portion 28. By means of these leaf spring portions 24, in each plate member 3a (3b), the outermost circumferential part thereof (i.e. the $\theta$ stage 25) is made movable with respect to the X, Y and $\theta$ directions, relative to the fixed portion 28. The fine-motion $\theta$ stage 25 is supported by the fine-motion X stage 26 through four leaf spring portions 24, while the fine-motion X stage 26 is supported by the fine-motion Y stage 27 through four leaf spring portions 24. The fine-motion Y stage 27 is supported by the fixed portion 28 through four leaf spring portions 24.

Figure 3:
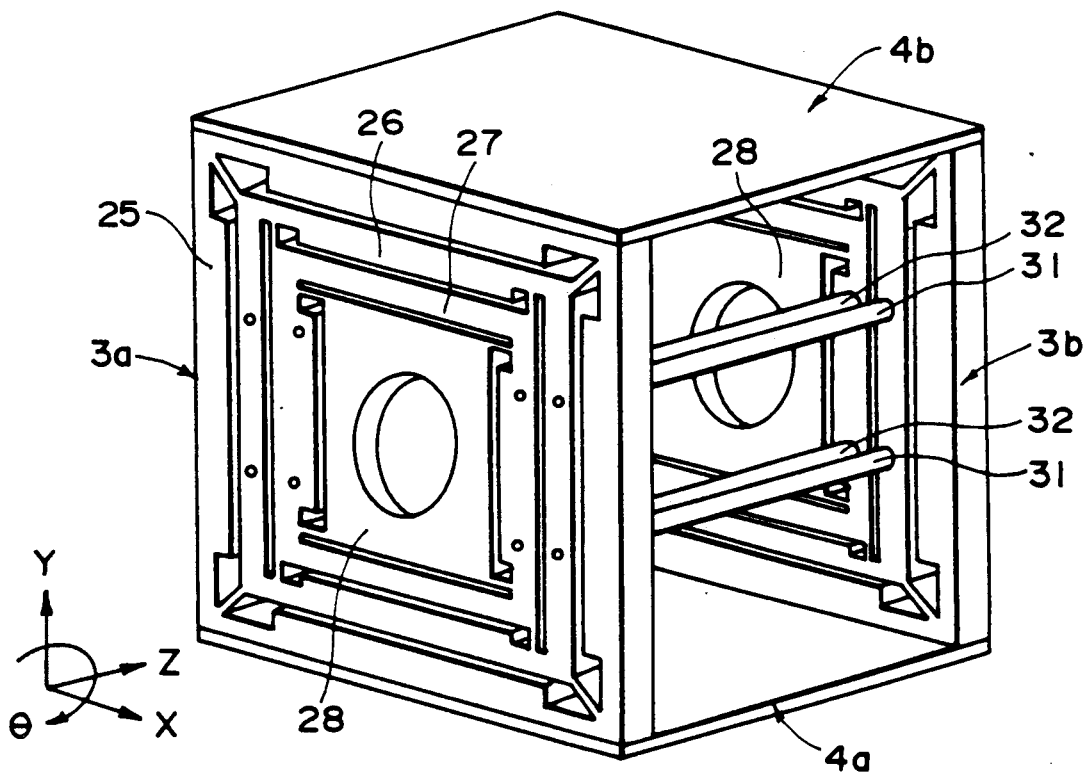
FIG. 3 is a perspective view illustrating the manner of coupling of plate members by means of coupling plates.

FIG. 3 is a perspective view illustrating the manner of coupling the plate members 3a and 3b by means of the coupling plates 4a and 4b. The fine-motion X stages 26 of the plate members 3a and 3b are coupled with each other by means of four coupling rods 31 (only two are illustrated), the fine-motion Y stages 27 of them are coupled to each other by means of four coupling rods 32 (only two are illustrated), and the fine-motion $\theta$ stages 25 of them are coupled to each other by means of the coupling plates 4a and 4b. Additionally, the innermost parts 28 of the plate members 3a and 3b are fixed to the coupling plates 2a and 2b shown in FIG. 1, respectively. In this manner, those of the fine-motion $\theta$ stages 25, fine-motion X stages 26 and fine-motion Y stages 27 of the plate members 3a and 3b having the same driving direction, are coupled to each other.

Figure 4:
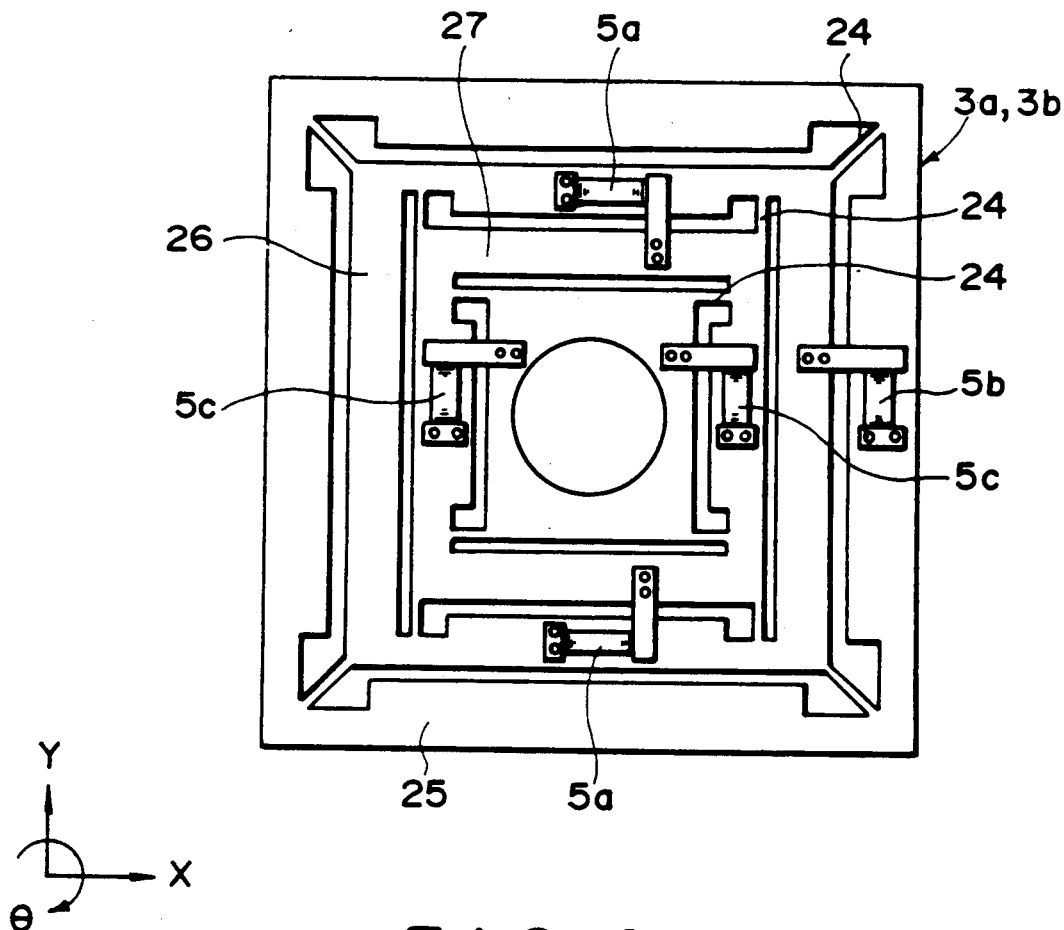
FIG. 4 is a plan view showing electrostrictive devices provided on a plate member.

FIG. 4 is a plan view showing electrostrictive devices 5a, 5b and 5c which are provided on each plate member 3a (3b). Two electrostrictive devices 5c provided on the fine-motion Y stage 27 each have a point of action which is fixed to the fixed portion 28. These electrostrictive devices 5c serve to displace the fine-motion Y stage 27 in the Y direction relatively to the fixed portion 28, against the spring force provided by the leaf spring portions 24. Similarly, two electrostrictive devices 5a provided on the fine-motion X stage 26 have their points of action fixed to the fine-motion Y stage 27 and serve to displace the fine-motion X stage 26 in the X direction relatively to the fine-motion Y stage 27, against the spring force provided by the leaf spring portions 24. Also, the electrostrictive device 5b provided on the fine-motion $\theta$ stage 28 has a point of action fixed to the fine-motion X stage 26 and serves to rotationally displace the fine-motion $\theta$ stage 25 in the $\theta$ direction relatively to the fine-motion X stage 26, against the spring force provided by the leaf spring portions 24. The electrostrictive devices 5c are disposed along the X direction and on the opposite sides of the fixed portion 28. The electrostrictive devices 5b are disposed along the Y direction and on the opposite sides of the fine-motion Y stage 27.

Figure 5:
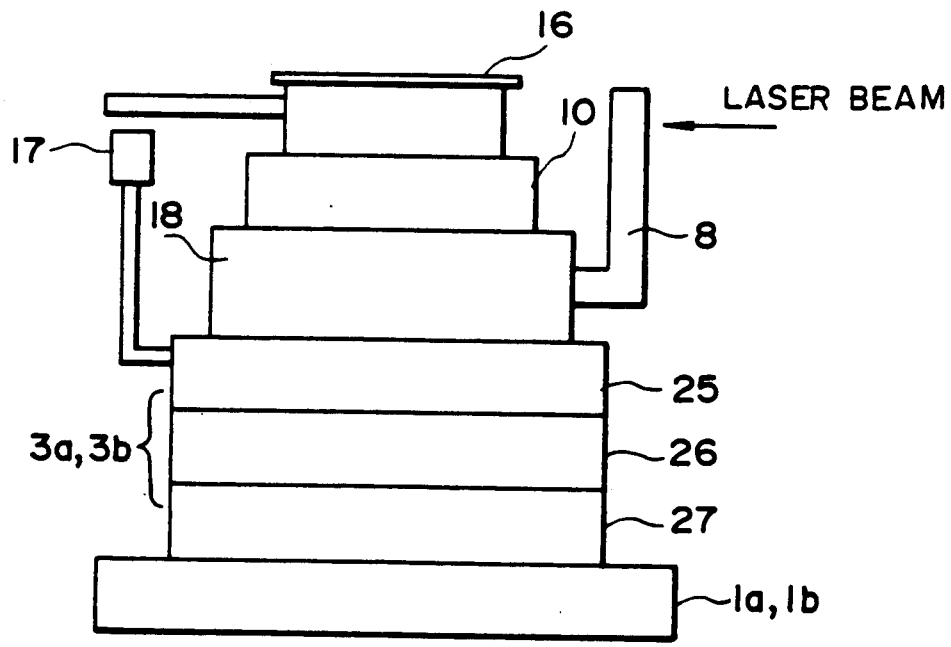
FIG. 5 is a schematic view showing the stage structure of the device of FIG. 1.
Figure 6:
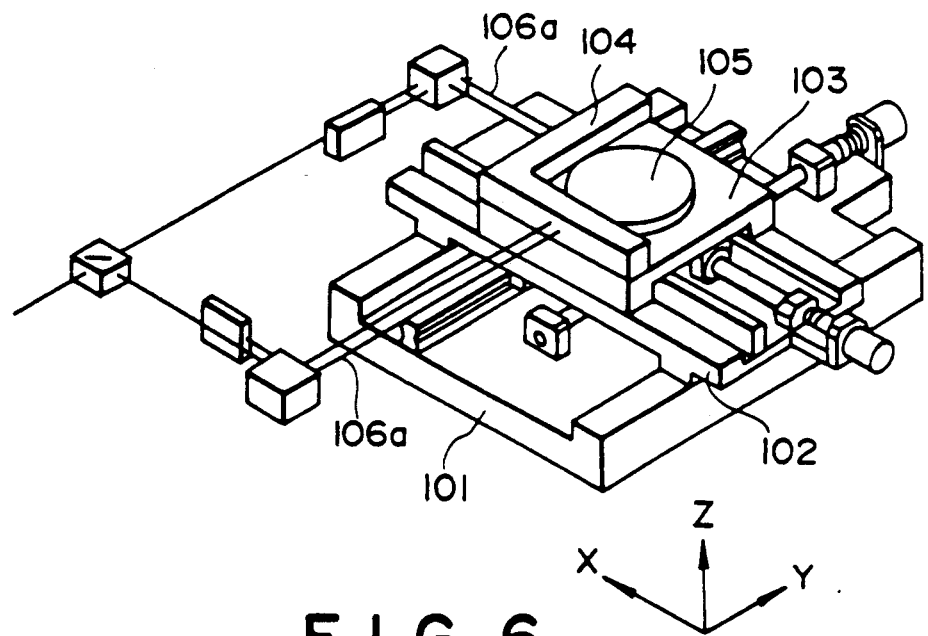
FIG. 6 is a perspective view showing a first example of a conventional stage device.
Figure 7:
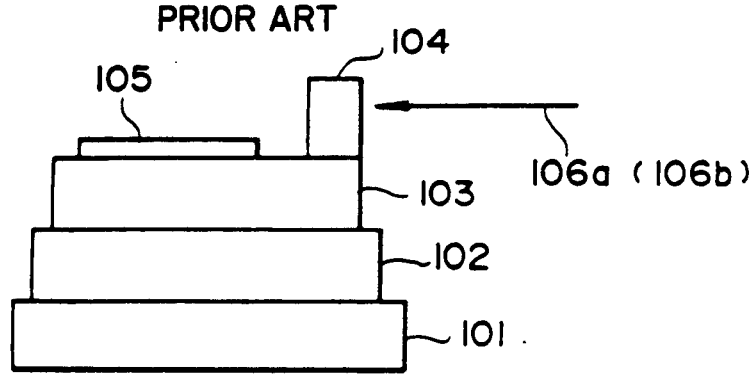
FIG. 7 is a schematic view showing the stage structure of the FIG. 6 device.
Figure 8:
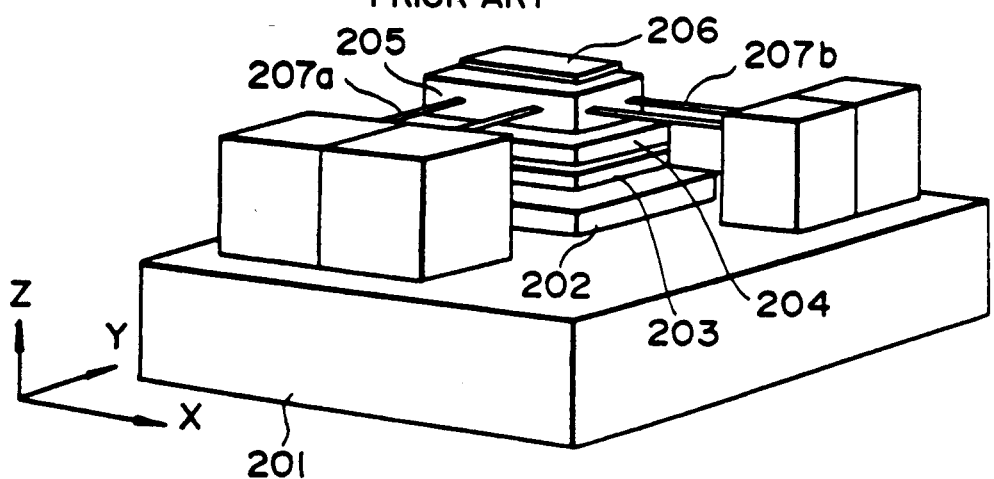
FIG. 8 is a perspective view of a second example of a conventional stage device.
Figure 9:
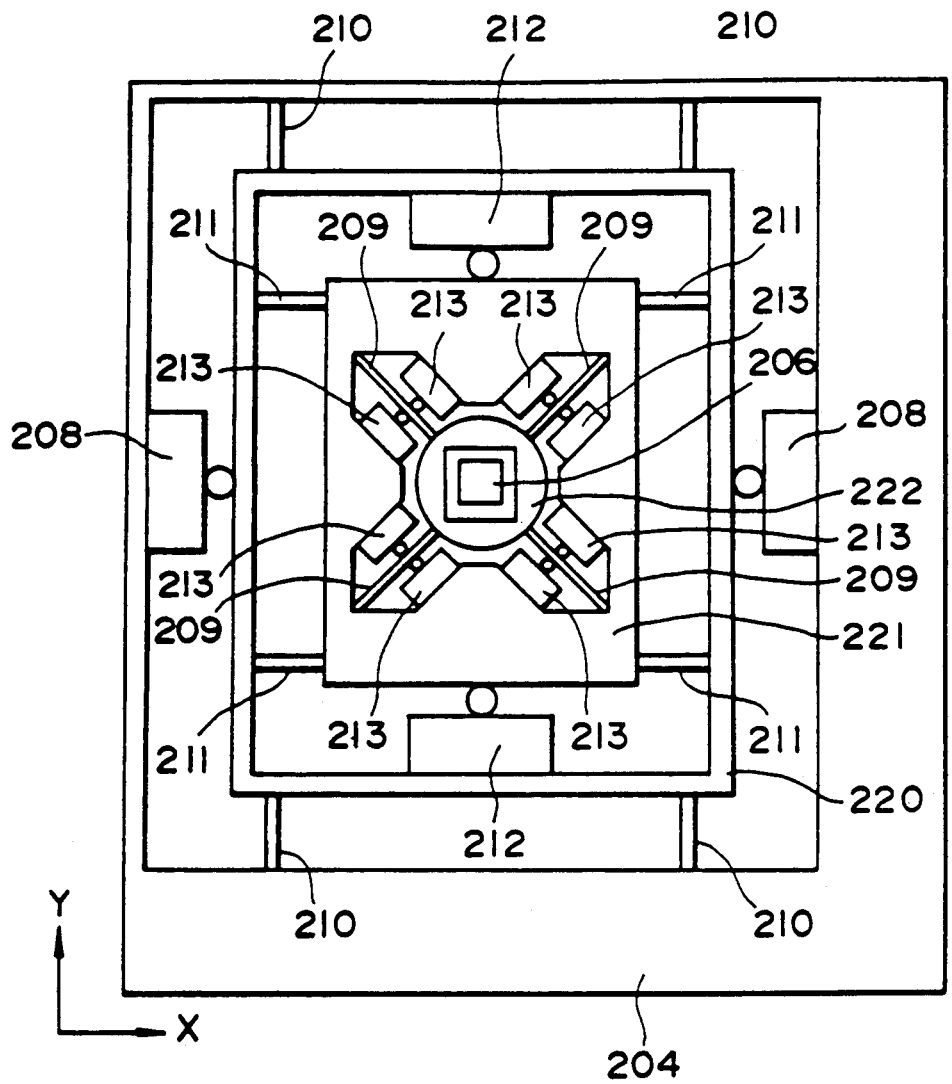
FIG. 9 is a plan view showing the structure of the FIG. 8 device.
Figure 10:
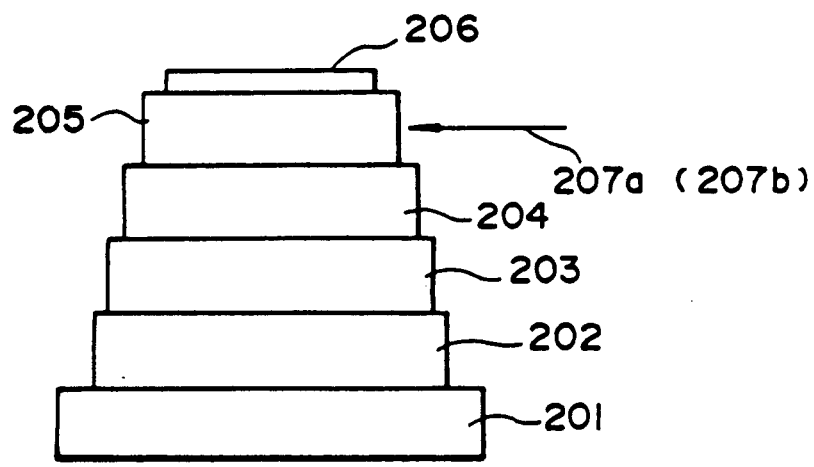
FIG. 10 is a schematic view showing the stage structure of the FIG. 8 device.

FIG. 5 is a schematic view showing the stage structure of the device of the present embodiment. As shown in this Figure, the device is structured such that: the fine motion X-Y-$\theta$ stage (27, 26, 25) is mounted on the linear air slider 1a (1b) through the fixed portion 28; the Z and tilt stage 18 is mounted thereupon through the fine-motion stage 25; and the rough-motion stage 10 is mounted thereupon. While in FIG. 5 the fine-motion X-Y-$\theta$ stage (27, 26, 25) is illustrated as being separated into three parts, actually the plate member 3a (3b) shown in FIG. 1 corresponds to such a tri-direction fine-motion stage (see FIGS. 2-4). Also, the Z and tilt stage 18 corresponds, in FIG. 1, to such a member which carries thereon a wafer 16 through a wafer chuck, which has a box-like shape as supported by the leaf springs 9 and the points of force of the lever hinges 6 and which has side surfaces that provide the distance measuring mirrors. The rough-motion θ stage corresponds to the wafer chuck having a rough-motion rotating function.

In the described structure, as the electrostrictive devices 5a, 5b and 5c are energized, the stages 27, 26 and 25 of the plate members 3a and 3b displace in the three directions of X, Y and θ. As a result, the box-like member 18 supported by the θ stage 25 of the plate member 3a through the leaf springs 9 displaces in the three directions of X, Y and θ as a unit with the stage 27. Subsequently, as the inch-worm motors 7 are energized, the three lever hinges 6 displace in the direction of arrow AR in FIG. 1, independently of each other. By this, the box-like member 18 is displaced in the Z and tilt directions.

As described hereinbefore, with the motion of the plate members 3a and 3b and the lever hinges 6, the measuring mirror 8 as well as the wafer chuck 10 disposed inside the mirror 8 displace at the same time in the directions of X, Y, θ, Z, tilt Wx and tilt Wy.

As the electrostrictive device 11 is energized, the wafer chuck 10 is independently rotated in the θ direction, relatively to the box-like member 18. On the other hand, as the electrostrictive device 13 is energized, the rotation of the wafer chuck can be locked. At this time, the angle of rotation is monitored by the eddy current sensor 17. On the other hand, any motion in each of the directions of X, Y, θ, tilt Wx and tilt Wy can be monitored by projecting laser beams from a laser interferometer upon the measuring mirror 8, in a well-known manner. The motion of the wafer chuck 10 in the tilt Wx direction and the tilt Wy direction, relative to the box-like member 18, can be monitored also by using the eddy current sensor 17. The temperature control of the wafer chuck 10 can be adjusted by flowing cooling water through the tubes 15a and 15b.

To provide a drive for the rotational rough-motion, a pulse motor or the like may be used. Also, the measuring mirror may be made of an aluminum alloy or the like. Further, the distance measurement using a laser beam may be replaced by measurement by using an eddy current sensor.

In the present embodiment, as described hereinbefore, two plate members each having a leaf spring function with respect to the X, Y and θ directions, are provided with a predetermined distance maintained therebetween, and the X, Y and θ parts of each plate member are coupled to corresponding parts of the other plate member, to thereby enhance the rigidity with respect to the tilt direction. Additionally, one or more lever hinges having an enlarging function are provided outside these plate members, to make it possible to increase the stroke in the tilt direction. Any motion in each of the X, Y, θ and tilt directions can be monitored by using a measuring mirror made of ceramics or by an eddy current sensor. Moreover, the provision of a rough-motion rotating mechanism inside the measuring mirror is effective to increase the angle of rotation. Also, the temperature of the wafer chuck is made adjustable. Particularly, enhancement of the rigidity in the tilt direction makes it possible to dispose the device vertically with its Z axis extending substantially horizontally. As a result, the device can be easily used for SOR lithography or the like.

While the invention has been described with reference to the structures disclosed herein, it is not confined to the details set forth and this application is intended to cover such modifications or changes as may come within the purposes of the improvements or the scope of the following claims.

What is claimed is:

1. A stage device, comprising:
   two plate members disposed with a predetermined distance in a Z direction maintained therebetween, each of said plate members comprising a fixed portion, a leaf spring portion, and a first stage portion which are defined by a plurality of grooves, wherein in each plate member, said first stage portion is supported by said fixed portion through said lead spring portion for movement in each of X, Y, and θ directions, relative to said fixed portion;
   first driving means for displacing said stage portions in each of the X, Y, and θ directions relative to said fixed portions, wherein each of said plate members is provided with a corresponding first driving means;
   coupling means for coupling said stage portions of said plate members to each other;
   a second stage portion supported by one of said stage portions through a resilient member, for movement in the Z direction relative to said plate members;
   second driving means for displacing said second stage portion in the Z direction relative to said plate members; and
   a holding chuck mounted to said second stage portion.

2. A device according to claim 1, further comprising a mirror provided as a unit with said second stage portion and being operable in combination with a laser interferometer.

3. A device according to claim 2, wherein said mirror comprises a box-like member that encircles said holding chuck and wherein said box-like member is made of ceramics and comprises a side surface that provides a reflection surface.

4. A device according to claim 1, wherein said second stage portion is supported by one of said first stage portions through a leaf spring, for movement in the Z and tilt direction, relative to said plate member, and wherein said second driving means comprises three electrostrictive devices for displacing the second stage portion in the Z and tilt direction.

5. A device according to claim 4, further comprising a mirror provided as a unit with said second stage portion and being operable in combination with a laser interferometer.

6. A device according to claim 1, wherein said second stage portion comprises third driving means for rotationally displacing said holding chuck in the θ direction relative to said second stage portion, and locking means for locking rotational displacement of said holding chuck in the θ direction relative to said second stage portion.

7. A device according to claim 6, wherein said second stage portion is supported by one of said first stage portions through a leaf spring, for movement in the Z and tilt direction relative to said plate member, and wherein said second driving means comprises three electrostrictive devices for displacing said second stage portion in the Z and tilt direction.

8. A device according to claim 7, further comprising a mirror provided as a unit with said second stage portion and being operable in combination with a laser interferometer.

9. A device according to claim 8, wherein said second stage portion comprises measuring means for measuring rotational position of said holding chuck with respect to the θ direction and relative to said second stage portion.

10. A device according to claim 9, wherein each of said third driving means and said locking means comprises an electrostrictive element and wherein said measuring means comprises an eddy current sensor.

11. A device according to claim 1, wherein said holding chuck comprises a piping arrangement for temperature control of an article held by said holding chuck.

12. A device according to claim 1, wherein each of said first stage portions includes comprise an X stage, a Y stage, and a θ stage, formed in said plate member concentrically with respect to the center of said fixed portion, and wherein a leaf spring portion is provided between adjacent stages.

13. A device according to claim 12, wherein said first driving means comprises a plurality of electrostrictive elements, each being provided for a corresponding one of said X stage, Y stages, and θ stage.

14. A device according to claim 12, wherein said coupling means comprises means for coupling said X stages, Y stages and θ stages of said plate members.

15. A stage device, comprising:
two plate members disposed with a predetermined distance maintained therebetween in a substantially horizontal Z direction, each of said plate member comprising a first stage portion defined by a plurality of grooves and being displaceable in each of X, Y, and θ directions;
first driving means for displacing said stage portions in each of the X, Y, and θ directions, wherein each of said plate members has a corresponding first driving means;
coupling means for coupling said first stage portions of said plate members to each other;
a second stage portion supported by one of said first stage portions, for displacement in the Z direction relative to said plate member; and
second driving means for displacing said second stage portion in the Z direction relative to said plate member.

16. A stage device, comprising:
a base unit;
a pair of plate members disposed to sandwich said base unit therebetween, each of said pair of plate members comprising a fixed portion, a leaf spring portion, and a first stage portion defined by notches, wherein, in each plate member, said fixed portion is fixed to said base unit and said first stage portion is movably supported by said leaf spring portion relative to said fixed portion, said first stage portions being movable in a predetermined direction;
a coupling member for coupling said first stage portions of said pair of plate members to each other; and
a second stage portion supported on one of said first stage portions of said pair of plate members, through a resilient member, said second stage portion being movable in a direction different from the direction in which said first stage portions are movable.

17. A device according to claim 16, further comprising a holding chuck, mounted to said second stage portion, for holding an article by attraction.

18. A device according to claim 17, further comprising a mirror, mounted to said second stage portion, for use with a laser interferometer.

19. A device according to claim 16, wherein said first stage portions of said pair of plate members are movable parallel to an X-Y plane and wherein said second stage portion is movable in a substantially horizontal Z direction.

20. A device according to claim 19, wherein said pair of plate members oppose each other and are disposed with a predetermined spacing along the Z direction.

* * * * *

UNITED STATES PATENT AND TRADEMARK OFFICE
CERTIFICATE OF CORRECTION

PATENT NO. : 5,066,131

DATED : November 19, 1991

INVENTOR(S) : Mikio Iwata, et al.

Page 1 of 2

It is certified that error appears in the above-identified patent and that said Letters Patent is hereby corrected as shown below:

ON THE COVER PAGE

IN THE ABSTRACT

Line 5, "to" should read --to a--.

IN THE DISCLOSURE

COLUMN 1

Line 49, "drive" should read --drives--.

COLUMN 4

Line 43, "stage 28" should read --stage 25--;
Line 59, "motion" should read --motion $\theta$--;
Line 60, the right margin should be closed up; and
Line 61, the left margin should be closed up.

UNITED STATES PATENT AND TRADEMARK OFFICE
CERTIFICATE OF CORRECTION

PATENT NO. : 5,066,131

DATED : November 19, 1991

INVENTOR(S) : Mikio Iwata, et al.

It is certified that error appears in the above-identified patent and that said Letters Patent is hereby corrected as shown below:

COLUMN 6

Line 13, "lead" should read --leaf--.

COLUMN 7

Line 15, "includes comprise" should read --comprises--;
    Line 24, "stages," should read --stage,--; and
    Line 31, "member" should read --members--.

Signed and Sealed this

Thirteenth Day of April, 1993

Attest:

STEPHEN G. KUNIN

*Attesting Officer*     *Acting Commissioner of Patents and Trademarks*